(12) United States Patent
Pang et al.

(10) Patent No.: US 10,649,291 B2
(45) Date of Patent: May 12, 2020

(54) ARRAY SUBSTRATE AND METHOD FOR MANUFACTURING THE SAME, DISPLAY PANEL AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Dong Pang, Beijing (CN); Xiaofei Yang, Beijing (CN); Dongjie Qin, Beijing (CN); Xu Liu, Beijing (CN); Zhengdong Zhang, Beijing (CN); Mingzhou Guo, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

(*) Notice: Subject to any disclaimer, the term of this patent is extended or adjusted under 35 U.S.C. 154(b) by 0 days.

(21) Appl. No.: 16/120,823

(22) Filed: Sep. 4, 2018

(65) Prior Publication Data
US 2019/0258125 A1    Aug. 22, 2019

(30) Foreign Application Priority Data
Feb. 22, 2018    (CN) .......................... 2018 1 0153854

(51) Int. Cl.
*H01L 27/12*    (2006.01)
*G02F 1/1362*    (2006.01)
*G02F 1/1333*    (2006.01)
*G02F 1/1368*    (2006.01)

(52) U.S. Cl.
CPC .. *G02F 1/136227* (2013.01); *G02F 1/133345* (2013.01); *G02F 1/136286* (2013.01); *H01L 27/124* (2013.01); *H01L 27/1248* (2013.01); *H01L 27/1259* (2013.01); *H01L 27/1288* (2013.01); *G02F 1/1368* (2013.01); *G02F 2001/136236* (2013.01)

(58) Field of Classification Search
CPC ....................................................... H01L 27/124
See application file for complete search history.

(56) References Cited

U.S. PATENT DOCUMENTS

2015/0187948 A1* 7/2015 Misaki .............. H01L 29/41733
257/43

* cited by examiner

*Primary Examiner* — William A Harriston
(74) *Attorney, Agent, or Firm* — Nath, Goldberg & Meyer; Joshua B. Goldberg (57) ABSTRACT

An array substrate and a method for manufacturing the same, a display panel and a display device are provided. The array substrate includes a gate layer, a gate insulation layer, a source-drain layer, a first passivation layer and an ITO layer successively formed on a base substrate, a first through hole in the first passivation layer and a second through hole in the gate insulation layer, and a second passivation layer; and a part of the second passivation layer is arranged in the first and second through holes to cover a part of the ITO layer in the first through hole and the second through hole.

13 Claims, 8 Drawing Sheets

FIG.1c through-hole region

FIG.1d through-hole region

FIG.1e through-hole region

FIG.1f through-hole region

FIG.1g peripheral wiring region

FIG.2a peripheral wiring region

FIG.2b peripheral wiring region

FIG.2c peripheral wiring region

FIG.2d peripheral wiring region

FIG.2e peripheral wiring region

FIG.2f effective display region

FIG.3a effective display region

FIG.3f effective display region

FIG.3g effective display region

ARRAY SUBSTRATE AND METHOD FOR MANUFACTURING THE SAME, DISPLAY PANEL AND DISPLAY APPARATUS

CROSS-REFERENCE TO RELATED APPLICATIONS

The present application claims the priority to the Chinese Patent Application No. 201810153854.1, filed on Feb. 22, 2018, to the Chinese Intellectual Property Office, the contents of which are incorporated herein in their entirety by reference.

TECHNICAL FIELD

The present disclosure relates to the field of display technology, and in particular to an array substrate and a method for manufacturing the same, a display panel and a display apparatus.

BACKGROUND

For preparing a TFT-LCD (Thin Film Transistor Liquid Crystal Display), it is required to form a through-hole for electrical connection in a film layer above a substrate, and then form an ITO (Indium Tin Oxide) layer on the through-hole. In a process of forming the ITO layer, dirt and impurities are prone to enter the through-hole. In addition, the ITO layer has poor compactness and water vapor is easy to pass through the ITO layer to be in direct contact with a metal such as Mo, AL and Nd in a gate layer or a source-drain layer below the ITO layer, which will lead to electrochemical corrosion, and damage performance of the film layer and reduce product yield.

SUMMARY

The present disclosure provides an array substrate and a method for manufacturing the same, a display panel and a display apparatus.

The array substrate, divided into a through-hole region, a peripheral wiring region and an effective display region, includes a gate layer, a gate insulation layer, a source-drain layer, a first passivation layer, and an ITO layer successively formed on a base substrate, and the array substrate further includes a first through hole in the first passivation layer and a second through hole in the gate insulation layer, and a second passivation layer; and a part of the second passivation layer is arranged in the first and second through holes to cover a part of the ITO layer in the first through hole and the second through hole.

In an embodiment, the through-hole region includes a first through-hole sub-region and a second through-hole sub-region, the first through-hole sub-region is provided with the gate layer, the gate insulation layer, the source-drain layer and the first passivation layer successively formed on the base substrate, the ITO layer formed on the first passivation layer and in the first through hole, and the second passivation layer formed on the ITO layer in the first through hole; and the second through-hole sub-region is provided with the gate layer, the gate insulation layer, the ITO layer formed on the gate insulation layer and in the second through hole, and the second passivation layer formed on the ITO layer in the second through hole.

The above array substrate is provided with the second passivation layer, and a part of the second passivation layer is arranged on the ITO layer in the first through hole and the second through hole. In a subsequent preparation process, the part of the second passivation layer on the ITO layer in the first and second through holes can separate the ITO layer from dust, impurities, water vapor and the like to protect the ITO layer and a metal layer under the ITO layer, and prevent dust, impurities, water vapor and the like from being in contact with the ITO layer in the first and second through holes and prevent water vapor from passing through the ITO layer to be in contact with the metal layer under the ITO layer, thus avoiding corrosion of the ITO layer and the metal layer and increasing the product yield.

In an embodiment, a part of the second passivation layer covers a part of the ITO layer at the peripheral wiring region.

In an embodiment, a thickness of the second passivation layer is less than that of the first passivation layer.

In an embodiment, the ITO layer is connected to the source-drain layer via the first through hole, and the ITO layer is connected to the gate layer via the second through hole.

The present disclosure further provides a display panel, including any of the above array substrates and a color filter substrate opposite to the array substrate.

The present disclosure further provides a display apparatus, including any of the above display panels and a backlight arranged at a backside of the display panel to provide light for the display panel.

The present disclosure further provides a method for manufacturing an array substrate, the array substrate is divided into a through-hole region, a peripheral wiring region and an effective display region, and the method including steps of forming a gate layer, a gate insulation layer, a source-drain layer, a first passivation layer and an ITO layer successively on a base substrate such that the ITO layer is provided in a first through hole in the first passivation layer and a second through hole in the gate insulation layer, the method further comprises steps of: after forming the ITO layer and before further performing a patterning process on the ITO layer, forming a second passivation layer on the ITO layer; forming a photoresist layer on the second passivation layer, and performing an exposure and development process on the photoresist layer using a halftone mask such that a part of the photoresist layer, corresponding to the first and second through holes at the through-hole region, is completely retained, a part of the photoresist layer, corresponding to a part of the ITO layer at the effective display region which will be etched out, is completely removed, and a part of the photoresist layer, corresponding to a part of the ITO layer which will not be etched out at the effective display region, and a part of the ITO layer at the through-hole region except the first and second through holes, is thinned; performing a first etching on the second passivation layer to expose the part of the ITO layer at the effective display area which will be etched out; performing an ashing process on the photoresist layer to remove the photoresist layer at the effective display region and the photoresist layer at the through-hole region except the first and second through holes, and then performing an etching process on an exposed part of the ITO layer to form a pattern of the ITO layer; performing a second etching on the second passivation layer to completely remove the part of the second passivation layer at the through-hole region except the first and second through holes and at the effective display region at which the part of the ITO layer will not be etched out; and peeling off the photoresist layer.

In an embodiment, the ashing process is performed on the photoresist layer before the exposed part of the ITO layer is etched; or the ashing process is performed on the photoresist layer after the exposed part of the ITO layer is etched.

In an embodiment, the method for manufacturing the array substrate further comprise a step of retaining the photoresist layer at the peripheral wiring region when performing the exposure and development process on the photoresist layer.

In an embodiment, a thickness of the second passivation layer is less than that of the first passivation layer.

DETAILED DESCRIPTION

Technical solutions of embodiments of the present disclosure will be described in detail below in conjunction with the drawings. The embodiments are merely examples, but not all embodiments of the present application. Ordinary skilled persons in the art can obtain other embodiments based on those described in the present disclosure without any creative work, which also fall into the scope of the present disclosure.

The present disclosure provides an array substrate which is roughly divided into three regions: a through-hole region, a peripheral wiring region and an effective display region. The through-hole region is for example provided with a thin film transistor for controlling display of a display panel including the array substrate, the peripheral wiring region is for example provided with transmission lines for various driving signals for driving the display of the display panel, and the effective display region is for example provided with pixel units for achieving the display of the display panel.

Figure 1A:
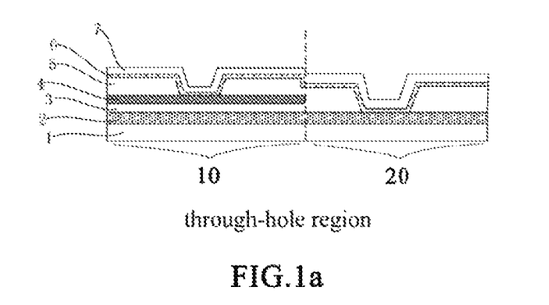
FIGS. 1a to 1g are schematic views illustrating structures at a through-hole region formed at various steps in a method for manufacturing an array substrate according to an embodiment of the present disclosure.
Figure 1B:
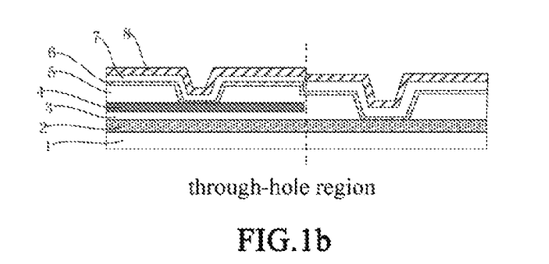
Figure 1C:
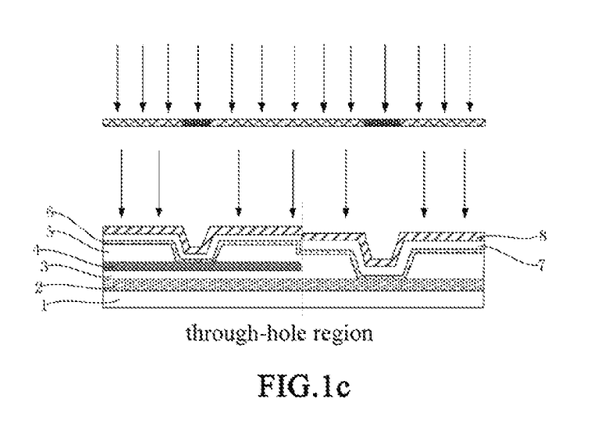
Figure 1D:
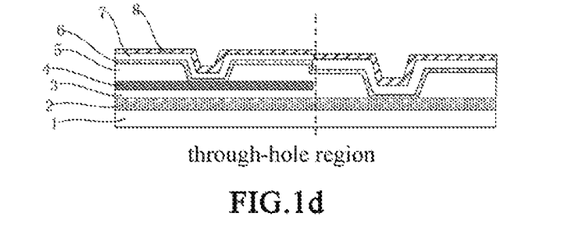
Figure 1E:
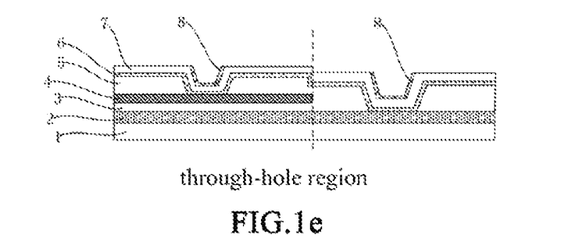
Figure 1F:
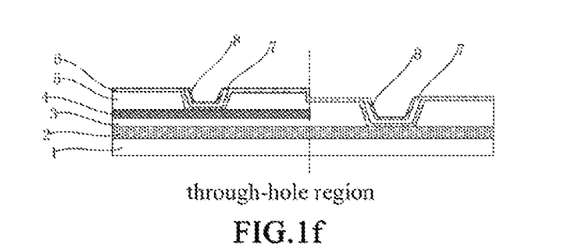
Figure 1G:
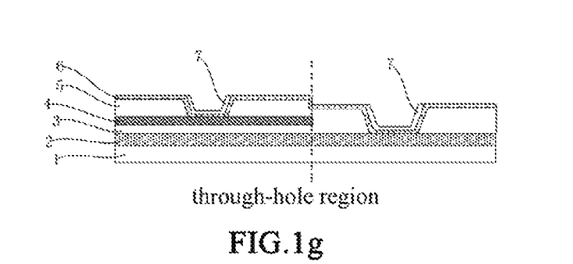

Firstly, referring to the schematic view of the structure at the through-hole region shown in FIG. 1g, an array substrate provided by an embodiment of the present disclosure includes a gate layer 2, a gate insulation layer 3, a source-drain layer 4, a first passivation layer 5 and an ITO layer 6 successively formed on a base substrate 1, a first through hole provided in the first passivation layer 5 and a second through hole provided in the gate insulation layer 3, and a second passivation layer 7. A part of the second passivation layer 7 is arranged in the first through hole and the second through hole to cover a part of the ITO layer 6 in the first through hole and the second through hole.

The above array substrate is provided with the second passivation layer 7, and a part of the second passivation layer 7 is arranged on the ITO layer 6 in the first through hole and the second through hole. In a subsequent preparation process, the part of the second passivation layer 7 on the ITO layer 6 in the first and second through holes can separate the ITO layer 6 from dust, impurities, water vapor and the like to protect the ITO layer 6 and a metal layer under the ITO layer 6, and prevent dust, impurities, water vapor and the like from being in contact with the ITO layer in the first and second through holes and prevent water vapor from passing through the ITO layer 6 to be in contact with the metal layer under the ITO layer 6, thus avoiding corrosion of the ITO layer 6 and the metal layer.

Thus, in the above array substrate, at the through-hole region, a part of the second passivation layer 7 is formed on the ITO layer 6 in the first and second through holes, which can protect the ITO layer 6 in the first and second through holes and a metal layer under the ITO layer 6, and prevent the ITO layer in the first and second through holes from being in contact with dust, impurities, water vapor and the like and prevent water vapor from passing through the ITO layer 6 to be in contact with the metal layer under the ITO layer 6, thus avoiding corrosion of the ITO layer 6 and the metal layer and improving product yield.

At the through-hole region of the array substrate shown in FIGS. 1a to 1g, a first through-hole sub-region 10 on one side of a dotted line is provided with the gate insulation layer 3, the source-drain layer 4, and the first passivation layer 5, and a second through-hole sub-region 20 on the other side of the dotted line is only provided with the gate insulation layer 3. The first through hole is formed in the first passivation layer 5 at the first through-hole sub-region 10 on the one side of the dotted line side, and the second through hole is formed in the gate insulation layer 3 at the second through-hole region 20 on the other side of the dotted line. The present disclosure is not limited thereto, the gate insulation layer 3 on the other side of the dotted line may also be replaced by a stack with the gate insulation layer at the bottom and the first passivation layer at the top, and in this case, the second through hole may be formed in the gate insulation layer and the first passivation layer at the second through-hole region 20 on the other side of the dotted line.

Figure 2A:
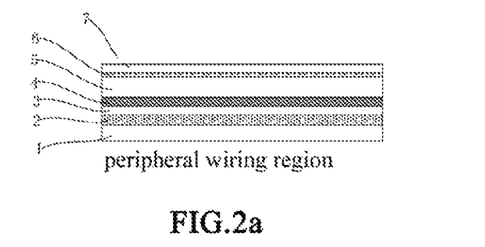
FIGS. 2a to 2f are schematic views illustrating structures at a peripheral wiring region formed at various steps in a method for manufacturing an array substrate according to an embodiment of the present disclosure.
Figure 2B:
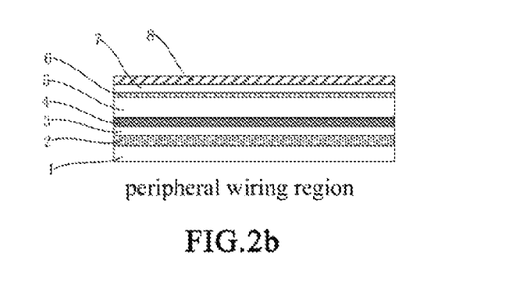
Figure 2C:
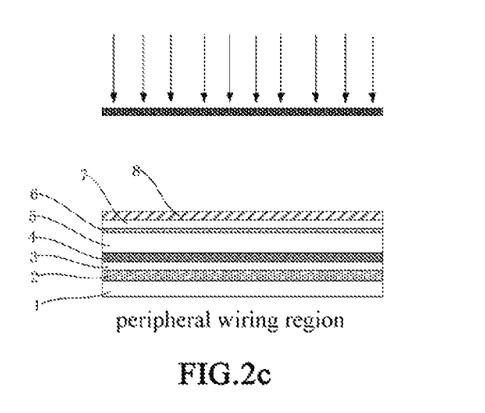
Figure 2D:
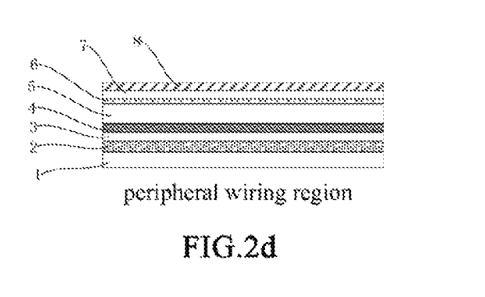
Figure 2E:
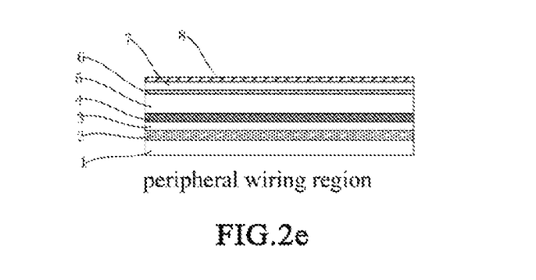
Figure 2F:
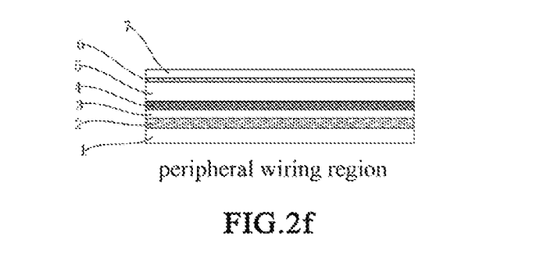

As shown in FIG. 2f, in the above array substrate, a part of the second passivation layer 7 also covers a part of the ITO layer 6 at the peripheral wiring region. The part of the second passivation layer 7 covering the part of the ITO layer 6 at the peripheral wiring region can increase a total thickness of all the passivation layers at the peripheral wiring region, enhances protection for the metal wiring at the peripheral wiring region, and reduces a risk of damage to the metal wiring at the peripheral wiring region.

A thickness of the second passivation layer 7 may be less than a thickness of the first passivation layer 5. The thickness of the second passivation layer 7 is less than that of the first passivation layer 5 so that the thickness of the part of the second passivation layer 7 covering the first and second through holes at the through-hole region is less than depths of the first and second through holes, and the part of the second passivation layer 7 covering the first and second through holes will not be outside the first and second through holes, which is convenient for patterning of the second passivation layer 7.

In the above array substrate, the ITO layer 6 is connected to the source-drain layer 4 via the first through hole, and the ITO layer 6 is connected to the gate layer 2 via the second through hole.

The present disclosure also provides a display panel including any one of the array substrates in the above and a color filter substrate 100 opposite to the array substrate.

In addition, the present disclosure also provides a display apparatus, including the display panel and a backlight 200 for providing light to the display panel.

Referring to FIGS. 1*a* to 1*g*, 2*a* to 2*f*, 3*a* to 3*h*, and 4, the present disclosure further provides a method for manufacturing an array substrate, including steps of forming a gate layer 2, a gate insulation layer 3, a source-drain layer 4, a first passivation layer 5, and an ITO layer 6 on a based substrate 1 successively. The ITO layer 6 is formed on the first passivation layer 5 and the gate insulation layer 3, as well as formed in a first through hole and a second through hole respectively provided in the first passivation layer 5 and the gate insulation layer 3. After forming the ITO layer 6 and before further performing a patterning process on the ITO layer 6, the method further includes the following steps S101 to S106.

Figure 3A:
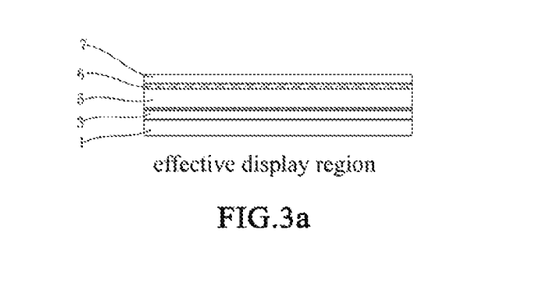
FIGS. 3a to 3h are schematic views illustrating structures at an effective display region formed at various steps in a method tier manufacturing an array substrate according to an embodiment of the present disclosure.
Figure 3B:
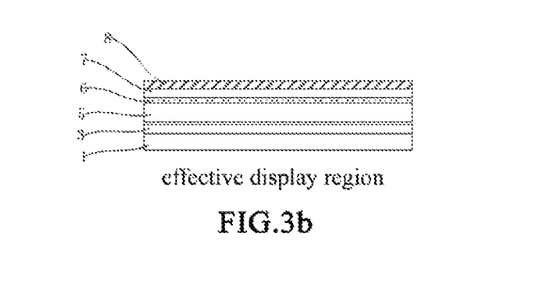
Figure 3C:
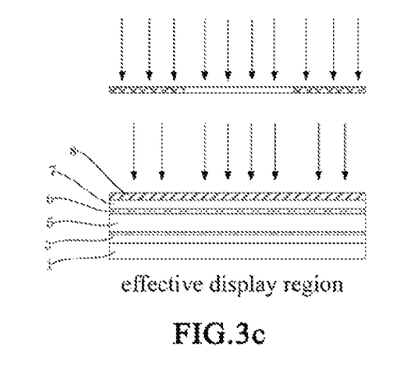
Figure 3D:
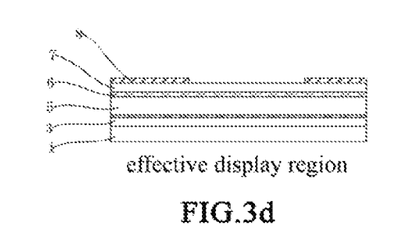

At step S101, as shown in FIGS. 1*a*, 2*a*, and 3*a*, a second passivation layer 7 is formed on the ITO layer 6.

At step S102, as shown in FIGS. 1*b* to 1*d* and FIGS. 3*b* to 3*d*, a photoresist layer 8 is formed on the second passivation layer 7, and the photoresist layer 8 is exposed and developed using a halftone mask so that a part of the photoresist layer 8, corresponding to the first and second through holes at the through-hole region, is completely retained, a part of the photoresist layer 8, corresponding to a part of the ITO layer 6 at the effective display region which will be etched out, is completely removed, and a part of the photoresist layer 8, corresponding to a part of the ITO layer 6 which will not be etched out at the effective display region, and a part of the ITO layer 6 at the through-hole region except the first and second through holes, is thinned.

Figure 3E:
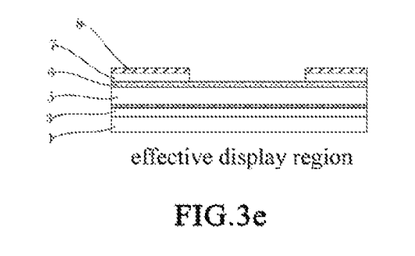

At step S103, as shown in FIG. 3*e*, a first etching is performed on the second passivation layer 7 to expose the part of the ITO layer 6 at the effective display area, which will be etched out.

Figure 3F:
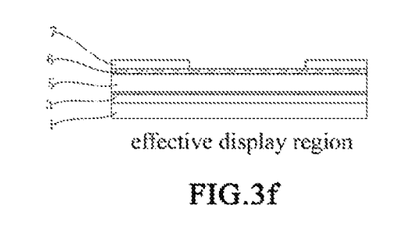
Figure 3G:
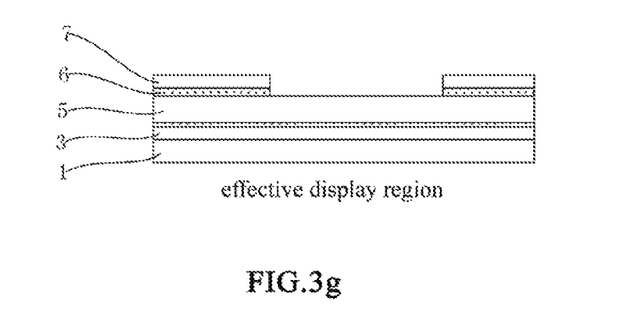

At step S104, as shown in FIGS. 1*e*, 3*f*, and 3*g*, an ashing process is performed on the photoresist layer to remove the photoresist layer at the effective display region and the photoresist layer at the through-hole region except the first and second through holes, and then the exposed part of the ITO layer 6 is etched to form a pattern of the ITO layer 6.

Figure 3H:
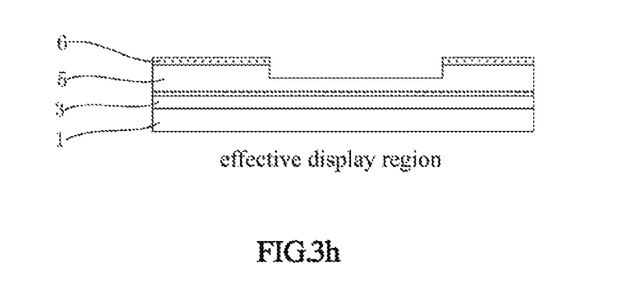
Figure 4:
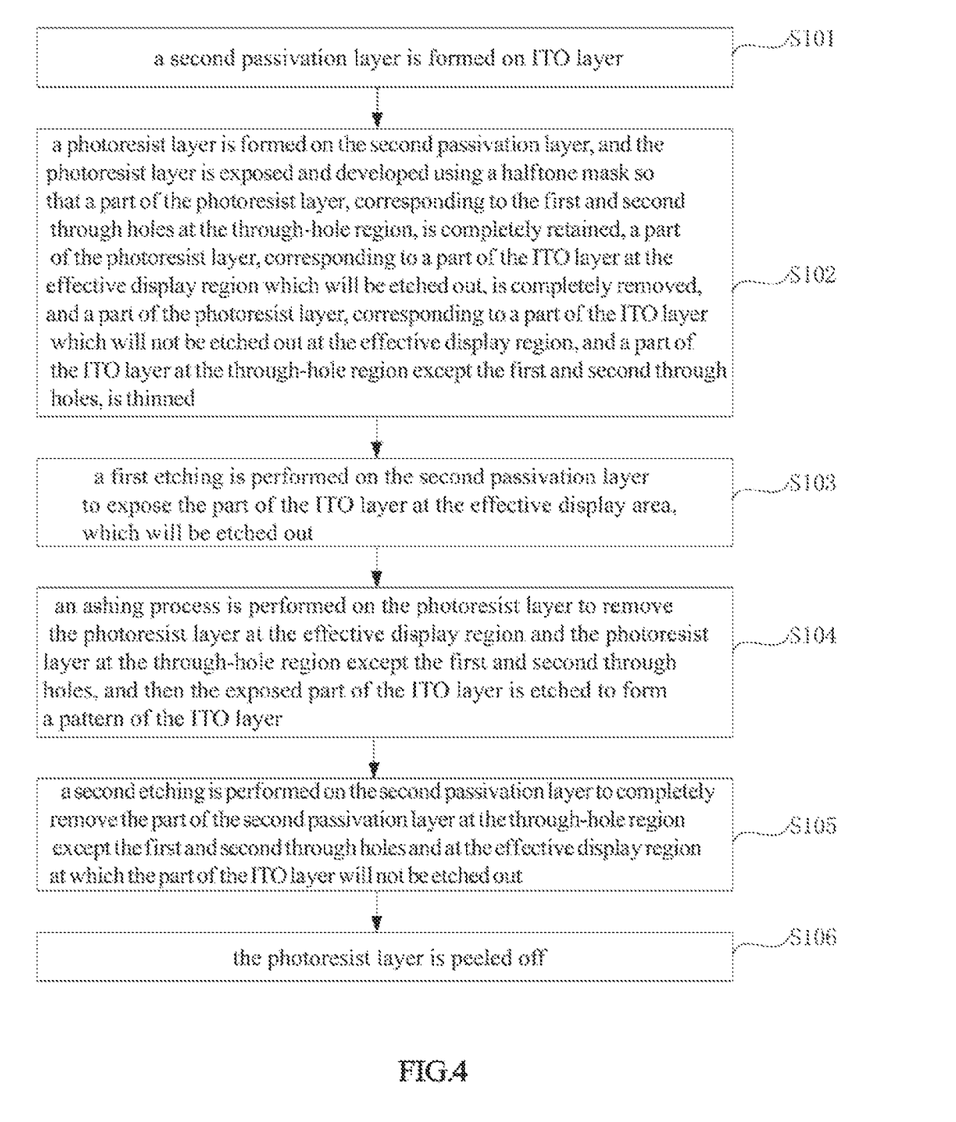
FIG. 4 is a flow chart of a method for manufacturing an array substrate according to an embodiment of the present disclosure.
Figure 5:
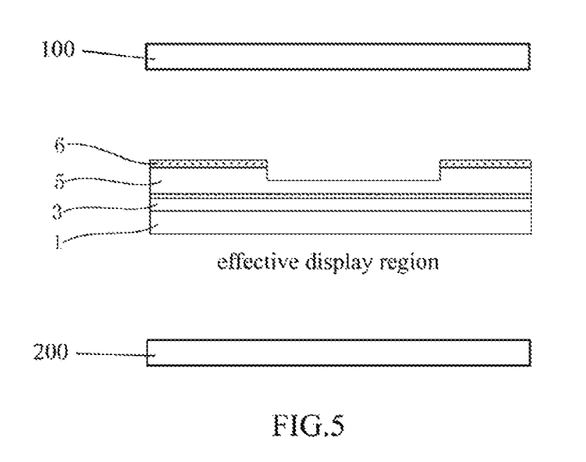
FIG. 5 is a schematic view of a display apparatus according to an embodiment of the present disclosure.

At step S105, as shown in FIGS. 1*f* and 3*h*, a second etching is performed on the second passivation layer 7 to completely remove the part of the second passivation layer 7 at the through-hole region except the first and second through holes and at the effective display region at which the part of the ITO layer 6 will not be etched out.

At step S106, as shown in FIG. 1*g*, the photoresist layer is peeled off.

In the above method, after forming the ITO layer 6 and before further performing the patterning process on the ITO layer 6, the second passivation layer 7 is formed on the ITO layer 6 at the step S101, as shown in FIG. 1*a*; the photoresist layer 8 is formed on the second passivation layer 7, and the photoresist layer 8 is exposed and developed using a halftone mask so that a part of the photoresist layer 8, corresponding to the first and second through holes at the through-hole region, is completely retained, a part of the photoresist layer 8, corresponding to a part of the ITO layer 6 at the effective display region which will be etched out, is completely removed, and a part of the photoresist layer 8, corresponding to a part of the ITO layer 6 which will not be etched out at the effective display region, and a part of the ITO layer 6 at the through-hole region except the first and second through holes, is thinned, at the step S102, as shown in FIGS. 1*b* to 1*d* and 3*b* to 3*d*. In this way, with only one exposure and development process, a part of the second passivation layer 7 will be remained on the ITO layer 6 in the first and second through holes while the ITO layer 6 is patterned in the subsequent manufacturing procedure. The part of the second passivation layer 7 on the ITO layer 6 in the first and second through holes protects the ITO layer 6 in the first and second through holes and a metal layer under the ITO layer 6 in the subsequent manufacturing process, prevent the ITO layer 6 in the first and second through holes from being in contact with dust, impurities, water vapor and the like, and avoiding water vapor passing through the ITO layer 6 to be in contact with the metal layer under the ITO layer 6, thus avoiding corrosion of the ITO layer 6 and the metal layer. Moreover, the second passivation layer 7 is formed and the ITO layer 6 is patterned with a single exposure and development process without increasing the number of the mask process and saving the preparation cost.

In the above method, the ashing process may be performed in the following two ways.

First way, as shown in FIGS. 3E to 3*g*, the ashing process is performed on the photoresist layer before the exposed part of the ITO layer 6 is etched.

Second way, the ashing process is performed on the photoresist layer after the exposed part of the ITO layer 6 is etched.

The ashing process may be performed on the photoresist layer before or after the exposed part of the ITO layer 6 is etched, thus increasing convenience and flexibility of the method.

As shown in FIGS. 2C and 2*d*, the method further includes a step of retaining the photoresist layer 8 at the peripheral wiring region when the photoresist layer 8 is exposed and developed. As shown in FIGS. 2*e* and 2*f*, after the photoresist layer 8 is peeled off, a part of the second passivation layer 7 covers the ITO layer 6 at the peripheral wiring region, which can increase a total thickness of all the passivation layers at the peripheral wiring region, enhances protection for the metal wiring at the peripheral wiring region, and reduces a risk of damage to the metal wiring at the peripheral wiring region.

A thickness of the second passivation layer 7 may be less than a thickness of the first passivation layer 5. The thickness of the second passivation layer 7 is less than that of the first passivation layer 5 so that the thickness of the part of the second passivation layer 7 covering the first and second through holes at the through-hole region is less than depths of the first and second through holes, and the part of the second passivation layer 7 covering the first and second through holes will not be outside the first and second through holes, which is convenient for patterning of the second passivation layer 7.

Obviously, a person skilled in the art may make various modifications and variations to the embodiments of this application without departing from the spirit and scope of this application. Thus, if these modifications and variations of this application fall within the scope of the claims and their equivalence, the application is also intended to include these modifications and variations.

What is claimed is:

1. An array substrate, divided into a through-hole region, a peripheral wiring region and an effective display region, comprising a gate layer, a gate insulation layer, a source-drain layer, a first passivation layer, and an ITO layer successively formed on a base substrate, wherein the array substrate further comprises a first through hole in the first passivation layer and a second through hole in the gate insulation layer, and a second passivation layer; and a part of the second passivation layer is arranged in the first and second through holes to contact and cover a part of the ITO layer in the first through hole and contact and cover a part of the ITO layer in the second through hole.

2. The array substrate of claim 1, wherein the through-hole region comprises a first through-hole sub-region and a second through-hole sub-region, the first through-hole sub-region is provided with the gate layer, the gate insulation layer, the source-drain layer and the first passivation layer successively formed on the base substrate, the ITO layer formed on the first passivation layer and in the first through hole, and the second passivation layer formed on the ITO layer in the first through hole; and the second through-hole sub-region is provided with the gate layer, the gate insulation layer, the ITO layer formed on the gate insulation layer and in the second through hole, and the second passivation layer formed on the ITO layer in the second through hole.

3. The array substrate of claim 2, wherein the ITO layer is connected to the source-drain layer via the first through hole, and the ITO layer is connected to the gate layer via the second through hole.

4. The array substrate of claim 1, wherein a part of the second passivation layer covers a part of the ITO layer at the peripheral wiring region.

5. A display panel, comprising the array substrate of claim 1 and a color filter substrate opposite to the array substrate.

6. The display panel of claim 5, wherein the through-hole region comprises a first through-hole sub-region and a second through-hole sub-region, the first through-hole sub-region is provided with the gate layer, the gate insulation layer, the source-drain layer and the first passivation layer successively formed on the base substrate, the ITO layer formed on the first passivation layer and in the first through hole, and the second passivation layer formed on the ITO layer in the first through hole; and the second through-hole sub-region is provided with the gate layer, the gate insulation layer, the ITO layer formed on the gate insulation layer and in the second through hole, and the second passivation layer formed on the ITO layer in the second through hole.

7. A display apparatus, comprising the display panel of claim 5 and a backlight arranged at a backside of the display panel to provide light for the display panel.

8. An array substrate, divided into a through-hole region, a peripheral wiring region and an effective display region, comprising a gate layer, a gate insulation layer, a source-drain layer, a first passivation layer, and an ITO layer successively formed on a base substrate, wherein the array substrate further comprises a first through hole in the first passivation layer and a second through hole in the gate insulation layer, and a second passivation layer; and a part of the second passivation layer is arranged in the first and second through holes to cover a part of the ITO layer in the first through hole and the second through hole;

wherein the through-hole region comprises a first through-hole sub-region and a second through-hole sub-region, the first through-hole sub-region is provided with the gate layer, the gate insulation layer, the source-drain layer and the first passivation layer successively formed on the base substrate, the ITO layer formed on the first passivation layer and in the first through hole, and the second passivation layer formed on the ITO layer in the first through hole;

the second through-hole sub-region is provided with the gate layer, the gate insulation layer, the ITO layer formed on the gate insulation layer and in the second through hole, and the second passivation layer formed on the ITO layer in the second through hole; and wherein a thickness of the second passivation layer is less than that of the first passivation layer.

9. A method for manufacturing an array substrate, the array substrate being divided into a through-hole region, a peripheral wiring region and an effective display region, and the method comprising steps of forming a gate layer, a gate insulation layer, a source-drain layer, a first passivation layer and an ITO layer successively on a base substrate such that the ITO layer is provided in a first through hole in the first passivation layer and a second through hole in the gate insulation layer, the method further comprises steps of:

forming a second passivation layer on the ITO layer after forming the ITO layer and before further performing a patterning process on the ITO layer, forming a photoresist layer on the second passivation layer, and performing an exposure and development process on the photoresist layer using a halftone mask such that a part of the photoresist layer, corresponding to the first and second through holes at the through-hole region, is completely retained, a part of the photoresist layer, corresponding to a part of the ITO layer at the effective display region which will be etched out, is completely removed, and a part of the photoresist layer, corresponding to a part of the ITO layer which will not be etched out at the effective display region, and a part of the ITO layer at the through-hole region except the first and second through holes, is thinned;

performing a first etching on the second passivation layer to expose the part of the ITO layer at the effective display area which will be etched out;

performing an ashing process on the photoresist layer to remove the photoresist layer at the effective display region and the photoresist layer at the through-hole region except the first and second through holes, and then performing an etching process on an exposed part of the ITO layer to form a pattern of the ITO layer;

performing a second etching on the second passivation layer to completely remove the part of the second passivation layer at the through-hole region except the first and second through holes and at the effective display region at which the part of the ITO layer will not be etched out; and peeling off the photoresist layer.

10. The method of claim 9, wherein the through-hole region comprises a first through-hole sub-region and a second through-hole sub-region, the first through-hole sub-region is provided with the gate layer, the gate insulation layer, the source-drain layer and the first passivation layer successively formed on the base substrate, the ITO layer formed on the first passivation layer and in the first through hole, and the second passivation layer formed on the ITO layer in the first through hole; and the second through-hole sub-region is provided with the gate layer, the gate insulation layer, the ITO layer formed on the gate insulation layer and in the second through hole, and the second passivation layer formed on the ITO layer in the second through hole.

11. The method of claim 10, wherein the ashing process is performed on the photoresist layer before the exposed part of the ITO layer is etched; or the ashing process is performed on the photoresist layer after the exposed part of the ITO layer is etched.

12. The method of claim 10, further comprising a step of retaining the photoresist layer at the peripheral wiring region when performing the exposure and development process on the photoresist layer.

13. The method of claim 10, wherein a thickness of the second passivation layer is less than that of the first passivation layer.

* * * * *